United States Patent [19]
Morris

[11] 4,419,632
[45] Dec. 6, 1983

[54] BIAS CIRCUIT FOR MICROWAVE FETS

[75] Inventor: James E. Morris, Emmaus, Pa.

[73] Assignee: Bell Telephone Laboratories, Incorporated, Murray Hill, N.J.

[21] Appl. No.: 329,868

[22] Filed: Dec. 11, 1981

[51] Int. Cl.³ .............................................. H03F 3/16
[52] U.S. Cl. ..................................... 330/277; 330/296
[58] Field of Search ........................ 330/277, 286, 296

[56] References Cited

U.S. PATENT DOCUMENTS

| | | | |
|---|---|---|---|
| 3,564,442 | 2/1971 | Germann | 330/54 X |
| 3,987,369 | 10/1976 | Yokoyama | 330/253 |
| 4,126,830 | 11/1978 | Schade, Jr. | 330/277 |
| 4,320,352 | 3/1982 | Rubin et al. | 330/277 |

Primary Examiner—James B. Mullins
Attorney, Agent, or Firm—Lester H. Birnbaum

[57] ABSTRACT

Disclosed is a circuit for biasing FETs which limits unwanted gate current. A first resistor ($R_8$) is coupled in series with the gate and the output (14) of a differential amplifier (12). Means such as a second resistor ($R_9$) and a Zener diode ($D_2$) are coupled to the first resistor and one input of the differential amplifier. Means such as a third resistor ($R_3$) is also coupled to one input of the amplifier. When excessive gate current appears, the voltage across the first resistor is such as to cause sufficient current flow through the diode and second and third resistors to unbalance the amplifier. This keeps the gate-to-source voltage of the FET at a region of gate current below some maximum value.

9 Claims, 6 Drawing Figures

BIAS CIRCUIT FOR MICROWAVE FETS

BACKGROUND OF THE INVENTION

This invention relates to bias circuits, and in particular to a bias circuit for a microwave FET.

Field Effect Transistors (FETs) have in recent years been replacing IMPATT diodes and other types of semiconductor devices in microwave amplifiers and oscillators. In a typical application, the FET which is driven by the microwave signal is biased by means of a differential amplifier which keeps the source-to-drain voltage and source current essentially constant. This is accomplished by applying the output of the differential amplifier to the gate electrode, while coupling one input of the amplifier to a reference level potential and the other input to a means, such as a resistor, for monitoring the source current. Changes in the source current unbalance the amplifier resulting in a suitable change in the potential applied to the gate to keep the source-to-drain voltage and source current essentially constant.

When a microwave signal of sufficient amplitude is applied to a Schottky-gate FET, a current can be generated between the gate and the source or drain of the FET. This gate current is essentially independent of the source-to-drain voltage and is therefore not controlled by the basic circuit previously described. When this gate current is excessive, device failures often result, apparently due to voids produced in the gate electrodes.

It is therefore a primary object of the invention to provide a means for preventing excessive gate current during the operation of an FET.

SUMMARY OF THE INVENTION

This and other objects are achieved in accordance with the invention which is a circuit for biasing a field effect transistor. The circuit includes a differential amplifier with its output adapted to be coupled to the gate of the transistor, a first input of the amplifier coupled to a reference potential level and a second input of the amplifier coupled to a means for sampling the source-to-drain voltage of the transistor. The amplifier is adapted to control the gate voltage in response to changes in the source-to-drain voltage to keep the source-to-drain voltage and source current essentially constant for gate currents which do not exceed some predetermined value. To control excessive gate current, the circuit further includes means for producing a voltage difference between the output of the amplifier and the conductor to be coupled to the gate electrode in response to currents generated at the gate, and means coupled between the output and second input of the amplifier. The latter means is responsive to the said voltage difference when the gate current exceeds the predetermined value for causing a change in the voltage at the input of the amplifier sufficient to adjust the output of the amplifier so that the gate current is kept below a maximum value.

BRIEF DESCRIPTION OF THE DRAWINGS

These and other features of the invention are delineated in detail in the following description. In the drawing.

DETAILED DESCRIPTION

Figure 1:
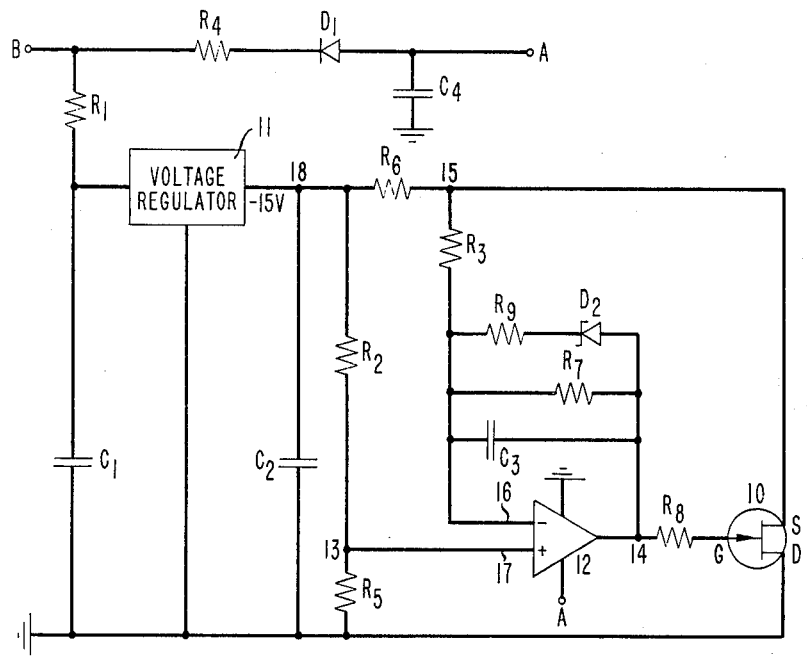
FIG. 1 is a circuit diagram of a bias circuit in accordance with one embodiment of the invention.

The circuit in accordance with one embodiment of the invention is illustrated in FIG. 1. Field Effect Transistor, 10, is shown coupled to a circuit which permits application of a constant dc voltage while keeping the source-drain voltage and source current essentially constant in accordance with the prior art. The circuit also includes elements which permit limiting unwanted gate current in accordance with the invention as described later.

A standard voltage regulator, 11, coupled in series with a means to sample the source current ($R_6$) and the source and drain of the FET, insures application of a constant voltage of a specified value at point 18 (in this case $-15$ volts) when a dc voltage is applied from terminal B (which in this example is $-24$ volts). The voltage regulator can be any standard type which is commercially available. Capacitor $C_1$ helps filter out any ripples in the voltage supplied to the regulator input and slows variations in the input voltage. Capacitor $C_2$ filters out ripples in the output of the regulator and can also prevent oscillations produced by some regulators. Resistor $R_1$ aids in preventing the regulator from running too hot by lowering the voltage from terminal B applied by the dc source (not shown).

In order to keep the source-to-drain voltage and source current of the FET constant, a differential amplifier, 12, is coupled to the gate electrode (G) of the device. The amplifier can be any standard one known in the art. A first input, 17, of the amplifier is coupled to a reference level portion, 13, where a voltage $V_R$ is formed during operation. This voltage depends on the ratio of $R_2$ and $R_5$ and the voltage applied by the regulator. The voltage will remain constant during the operation of the device and will in this example be approximately $-13.8$ volts. The second input, 16, is coupled to a means, in this case resistor $R_6$, which monitors the source current of the FET. A resistor, $R_3$, can be included between $R_6$ and the amplifier input to equalize the impedance of the two inputs of the amplifier. A resistor, $R_7$, and capacitor, $C_3$, are typically coupled in parallel between the second input and the output of the amplifier to provide a feedback loop to stabilize the amplifier. With the n-channel FET of this example, the first input, 17, is generally referred to in the art as the non-inverting input and the second input, 16, is referred to as the inverting input of the amplifier. The combination of resistor $R_4$, diode $D_1$, and capacitor $C_4$, provides the appropriate operating voltage to the amplifier, 12, from the dc potential applied at terminal B. $R_4$ prevents drawing unlimited current in case of a short and the combination of $D_1$ and $C_4$ sets the turn-on and turn-off times of the amplifier to protect the FET when the power is switched on and off.

As known in the art, any change in the voltage across $R_6$ as a result of variations in source current will unbalance the amplifier resulting in a signal from the amplifier which appropriately adjusts the gate voltage to maintain the desired source-to-drain voltage and desired current. However, gate current is not controlled by such an arrangement.

In accordance with a main feature of the invention, some means is included between the amplifier output and the gate of the FET for producing a voltage difference in response to any significant gate current. In this example, such means is a simple resistor, $R_8$. In accordance with another main feature of the invention, there is included, between the output of the amplifier and the second input, means which is responsive to the voltage produced between the amplifier output and FET gate electrode when the gate current exceeds a certain desired value. This means will cause a change in the voltage at the second input of the amplifier sufficient to adjust the output of the amplifier so that the gate current is limited to some maximum value (which is usually slightly higher than the desired value at which current limiting is initiated). In this example, the means includes a Zener diode, $D_2$, in series with a resistor, $R_9$.

Figure 2:
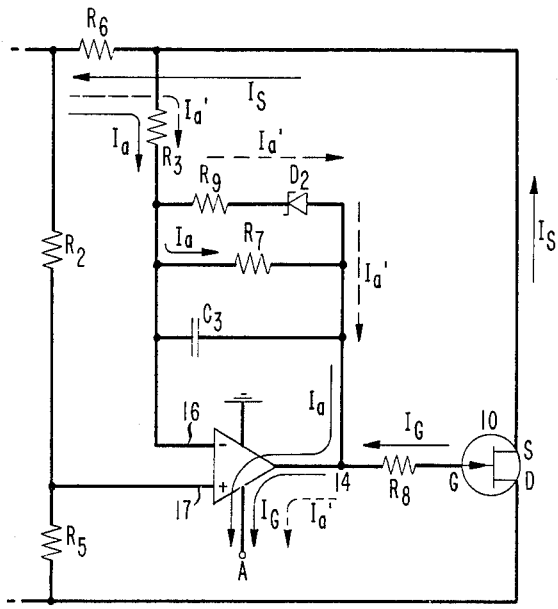
FIGS. 2-4 are portions of the same circuit illustrating current flow through the circuit during various stages of operation in accordance with the same embodiment.

The manner in which the circuit of FIG. 1 operates to limit gate current will now be described with reference to FIGS. 2–4. FIG. 2 shows current flow through a portion of the circuit when there is a negative gate current $I_G$ (current flowing out of the gate electrode). This gate current flows into the amplifier and through point A (to terminal B) as shown. The presence of $R_8$ causes a voltage difference between the amplifier output and gate so that the voltage at point 14 is more negative than the voltage at the gate. Source current flows through $R_6$ as shown, and a small current, $I_a$, flows through $R_3$ and $R_7$ and through point A during normal operation. Current flow through $R_9$ and $D_2$ will be blocked since $D_2$ is reverse-biased. Thus, during normal operation, the amplifier will act to keep source-to-drain voltage and source current essentially constant as in prior art circuits.

As negative gate current increases, however, the voltage at point 14 becomes more negative thus increasing the voltage across $D_2$. When the gate current reaches some desired value, the diode $D_2$ will break down causing flow of an additional current, $I_a'$, through $R_9$ and $D_2$ as shown by the dashed arrows. This additional current flow increases the voltage across $R_3$ sufficiently so that the second input, 16, of the amplifier is made more negative and the amplifier becomes unbalanced. The imbalance produces a less negative voltage at the output, 14, of the amplifier and at the gate electrode, G, to lower the gate-to-source voltage and thereby increase the source current and decrease the gate current below the desired maximum value. (This will also cause a slight decrease in source-drain voltage, which will be insignificant as long as $R_6$ is small.)

Figure 3:
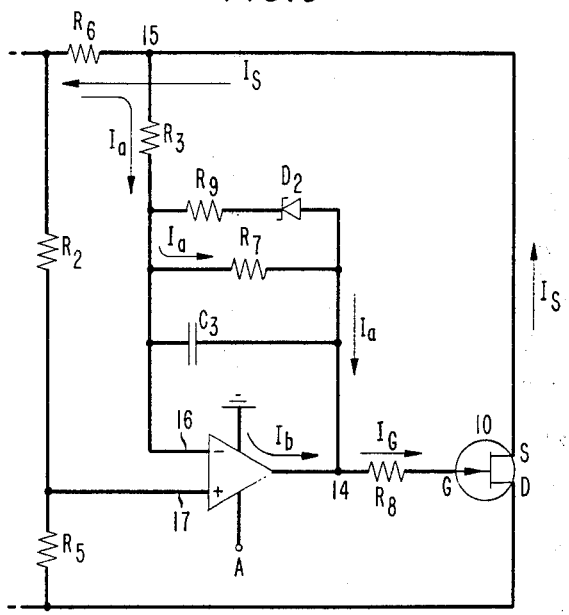
Figure 4:
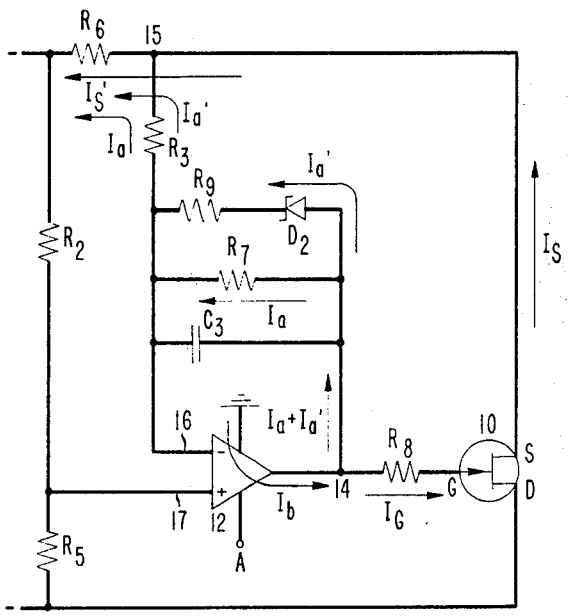

FIG. 3 illustrates current flows during normal operation when there is a positive gate current. Here, the gate current, $I_G$, will flow into the gate electrode as shown and will be the sum of current $I_b$ from the amplifier and $I_a$. Flow of currents $I_s$ and $I_a$ is otherwise as described previously. This condition will hold as long as the voltage at point 14 is more negative than the voltage at point 15.

If gate current increases to some desired value, however, the voltage at point 14 will become less negative than that at point 15. When this occurs, flow of current, $I_a$, will reverse itself as shown in FIG. 4. Since $D_2$ will now be forward biased, an additional current $I_a'$ will flow therethrough and through $R_9$. This current flow will increase the voltage across $R_3$ resulting in a less negative voltage at the input, 16, of the amplifier which, again, unbalances the amplifier. This will cause an output from the amplifier which is more negative, thus resulting in a more negative gate voltage, a decrease in the source current, and a reduction in the gate current below the desired maximum value. It will be realized that once the gate current reaches the desired value at which limiting is initiated the source current will no longer remain constant. It is generally desirable to vary the source current as little as possible while still limiting the gate current.

As a guide to one particular utilization of the inventive principles, and not by way of limitation thereof, the following parameters for the circuit shown in FIG. 1 may be used;

$R_1 = 5\Omega$
$R_2 = R_3 = 100\Omega$
$R_4 = 7\Omega$
$R_5 = 1150\Omega$
$R_6 = 1.47\Omega$
$R_7 = 100K\Omega$
$R_8 = 68\Omega$
$R_9 = 1000\Omega$
$C_1 = 22 \mu F$
$C_2 = 10 \mu F$
$C_3 = 0.01 \mu F$ The amplifier chosen was a standard operational amplifier which had an operating voltage of 16–30 volts and an output current of 40 milliamps when measured with a load resistor of 200 ohms. Most standard amplifiers can be used as long as the output current is higher than the desired maximum gate current. $D_1$ was a general purpose rectifier diode, the only requirement being that the reverse breakdown voltage is higher than the input voltage. $D_2$ was a Zener diode with a reverse breakdown voltage of 5.6 volts. This breakdown voltage is chosen according to the maximum desired gate current and the values of resistors used. The particular choice is well within the skill of workers in the art. The particular FET used was an n-channel Schottky-gate device with an 8 mm gate width, and a desired source current of approximately 0.8 amps and source-drain voltage of approximately $-13.8$ volts. Again, these values can vary according to particular needs.

Figure 5:
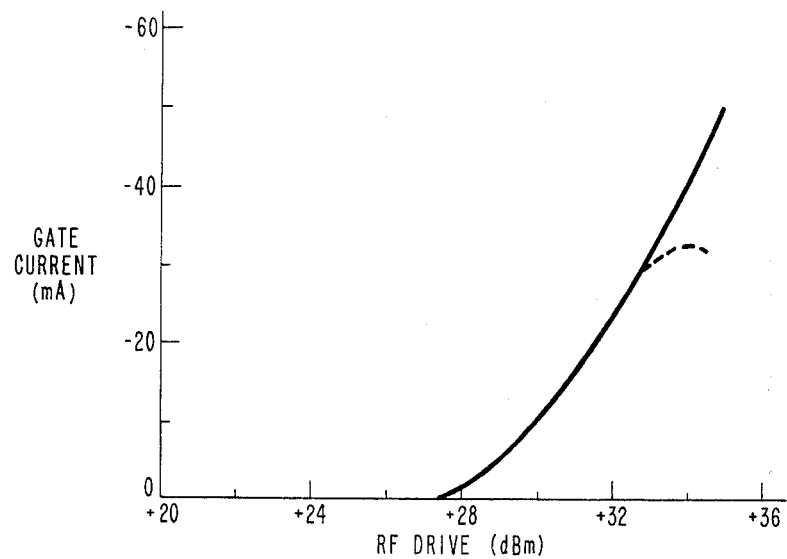
FIG. 5 is a graph illustrating the limitation of gate current in accordance with the same embodiment.

These parameters will typically produce a reference voltage at point 13 and a voltage at point 15 of approximately $-13.8$ volts with a voltage regulator designed to apply a voltage of approximately $-15$ volts. The limitation of gate current is illustrated in the graph of FIG. 5, showing gate current as a function of the amplitude of an RF signal applied to the FET. The solid line indicates the value of gate current which would result with no limiting means, while the dashed line illustrates limitation of the gate current utilizing the circuit in accordance with the embodiment shown in FIG. 1 and the parameters listed above.

Of course, it will be appreciated that parameters will be adjusted to fit particular needs. The desired maximum gate current will depend upon the particular construction of the FET and the reliability goals involved in the application of the device. In general, it is desirable to limit gate current to a value of less than 40 milliamps in order to prevent damage to the gate electrode, and choosing appropriate circuit parameters to achieve such result in accordance with the invention is within the ability of the skilled artisan.

It will be appreciated that circuit elements shown in FIG. 1, although preferred, may be replaced or even eliminated as long as the basic operation described above is fulfilled. For example, $D_2$ need not be a Zener diode, but could be any element with a sufficiently low breakdown voltage in the reverse direction to permit limiting negative gate current to a desired maximum value. $R_8$ and $R_9$ could be thermistors, and, in fact, $R_9$ could be eliminated in certain applications if a very abrupt limiting of gate current can be tolerated (the desired value at which limiting is initiated is essentially equal to the desired maximum gate current). If high stability is not needed, elements $R_7$ and $C_3$ may also be eliminated.

Figure 6:
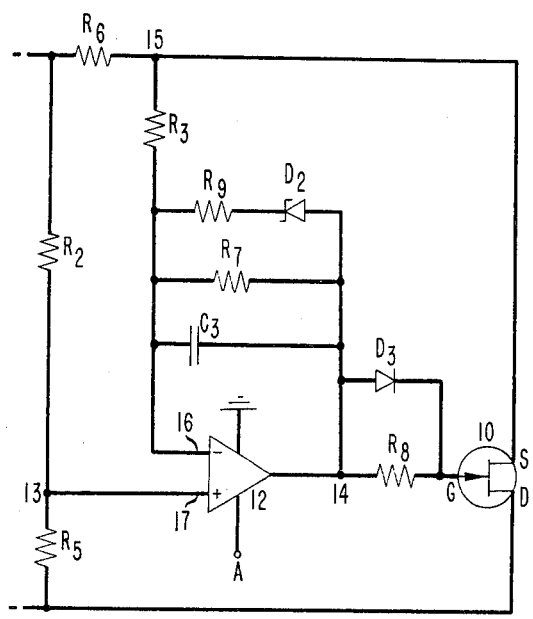
FIG. 6 is a circuit diagram of a portion of a circuit illustrating a further embodiment of the invention.

If desired, it is also possible to limit only one polarity of gate current. For example, the breakdown voltage of Zener diode $D_2$ can be chosen to be sufficiently high so that negative gate current will not initiate current limiting, while limiting of positive gate current will proceed as previously described. If only negative gate current is to be limited, the circuit of FIG. 6 can be employed. This circuit is essentially identical to FIGS. 1-4 except for the addition of a third diode, $D_3$, in parallel with resistor $R_8$ with its cathode coupled to the gate and its anode coupled to the output of the amplifier (point 14). Positive gate current would be shunted by this diode to prevent a sufficient voltage being generated across $R_8$ to result in gate current limiting. Negative gate current would be unaffected and so limiting would proceed as previously described. Of course, by reversing the polarity of the diode, $D_3$, only positive gate current would be limited.

Various additional modifications will become apparent to those skilled in the art. All such variations which basically rely on the teachings through which the invention has advanced the art are properly considered within the spirit and scope of the invention.

What is claimed is:

1. A circuit for biasing a field effect transistor comprising: a differential amplifier (12) with an output conductor adapted to be coupled to the gate (G) of the transistor, a first input (17) of the amplifier coupled to a reference potential portion (13) and a second input (16) of the amplifier coupled to a means ($R_6$) for sampling the source current ($I_s$) of the transistor, said amplifier adapted to control the gate voltage in response to changes in the source current to keep the source-to-drain voltage and the source current of the transistor essentially constant for gate currents no greater than a desired value;
characterized in that said circuit further includes; means ($R_8$) for producing a voltage difference between the output of the amplifier and the conductor to be coupled to the gate electrode in response to currents generated at said gate electrode; and
means ($D_2$, $R_3$, $R_9$) coupled to the second input of the amplifier, which means is responsive to said voltage between the output of the amplifier and gate conductor when said gate current exceeds a desired value for causing a change in the voltage at the second input of the amplifier sufficient to adjust the output of the amplifier so that said gate current is kept below a maximum value.

2. The circuit according to claim 1 wherein the means for producing a voltage between the output of the amplifier and the gate conductor comprises a resistor ($R_8$) coupled in series therebetween.

3. The circuit according to claim 1 wherein the means for causing a change in the voltage at the second input of the amplifier comprises a diode ($D_2$) and resistor ($R_9$) coupled in series between the amplifier output and second input and a resistor ($R_3$) coupled between the second input and a conductor adapted to be coupled to the source electrode(s) of the transistor.

4. The circuit according to claim 3 wherein the diode is a Zener diode.

5. The circuit according to claim 1 wherein the means for causing a change in voltage at the second input is responsive to the voltage between the amplifier output and gate conductor for both positive and negative gate current.

6. The circuit according to claim 3 wherein the diode has a sufficiently high breakdown voltage so as to be responsive only to gate current of one polarity.

7. The circuit according to claim 1 further comprising a second diode $D_3$ coupled in parallel with the means for producing a voltage difference so that only gate current of one polarity is kept below the desired maximum value.

8. The circuit according to claim 3 wherein the diode is coupled so as to be reverse-biased when there is negative gate current below the desired value, but the diode has a sufficiently low breakdown voltage to conduct when the negative gate current exceeds the desired value.

9. A circuit for biasing a Schottky-gate field effect transistor comprising: a differential amplifier (12) with an output coupled to the gate electrode (G) of the transistor, a first input (17) of the amplifier coupled to a reference potential portion (13) and a second input (16) of the amplifier coupled through a first resistor ($R_3$) to a means ($R_6$) for sampling the source current ($I_s$) of the transistor, said amplifier adapted to control the gate voltage in response to changes in the source current to keep the source-to-drain voltage and source current of the transistor essentially constant for gate currents not exceeding a desired value;
characterized in that said circuit further includes:
a second resistor ($R_8$) coupled between the output of the amplifier and the gate electrode for producing a voltage difference between the output of the amplifier and the gate electrode in response to currents generated at said gate electrode; and
a Zener diode ($D_2$) and a third resistor ($R_9$) coupled in series between the output and second input of the amplifier such that when a positive or negative gate current exceeds the desired value the said diode and third resistor in combination with said first resistor ($R_3$) will cause a sufficient change in the voltage at the second input to change the output of the amplifier and thereby keep the gate current below a maximum value.

* * * * *